United States Patent [19]
Denison et al.

[11] Patent Number: 5,911,833
[45] Date of Patent: Jun. 15, 1999

[54] METHOD OF IN-SITU CLEANING OF A CHUCK WITHIN A PLASMA CHAMBER

[75] Inventors: Dean Denison; William Harshbarger, both of San Jose; Anwar Husain, Pleasanton; C. Robert Koemtzopoulos, Hayward; Felix Kozakevich, Sunnyvale; David Trussell, Fremont, all of Calif.

[73] Assignee: LAM Research Corporation, Fremont, Calif.

[21] Appl. No.: 08/784,852

[22] Filed: Jan. 15, 1997

[51] Int. Cl.$^6$ ........................................... B44C 1/22
[52] U.S. Cl. ................. 134/1.1; 216/59; 216/67; 216/69; 438/905
[58] Field of Search ................. 216/59, 67, 69; 134/1.1; 438/905

[56] References Cited

U.S. PATENT DOCUMENTS

| | | | |
|---|---|---|---|
| 5,192,849 | 3/1993 | Moslehi | 219/121.43 |
| 5,207,836 | 5/1993 | Chang | 134/30 |
| 5,417,826 | 5/1995 | Blalock | 204/176 |
| 5,689,275 | 11/1997 | Moore et al. | 343/786 |

*Primary Examiner*—Lynette F. Smith
*Assistant Examiner*—Brenda G. Brumback
*Attorney, Agent, or Firm*—Lowe Hauptman Gopstein Gilman & Berner

[57] ABSTRACT

A method for in-situ cleaning of a chuck that bears a semiconductor wafer in a semiconductor manufacturing machine maintains a processing chamber in a sealed condition with the chuck inside the chamber. A wafer bearing surface of the chuck is exposed upon determining that the chuck requires a cleaning. A cleaning gas is then injected into the chamber and RF power is applied to the chamber to create a plasma that cleans the wafer bearing surface. Since the processing chamber is maintained in a sealed condition during the in-situ cleaning of the chuck, the time required to clean the chuck and prepare the chamber for continued production runs is greatly reduced.

17 Claims, 3 Drawing Sheets

METHOD OF IN-SITU CLEANING OF A CHUCK WITHIN A PLASMA CHAMBER

FIELD OF THE INVENTION

The present invention relates to the field of chemical vapor deposition systems, and more particularly, to methods of cleaning deposition left by the process gas on a wafer bearing surface of a chuck.

BACKGROUND OF THE INVENTION

Chemical vapor deposition (CVD) systems normally employ a chamber in which gaseous chemicals react. From these reactions, a substance is deposited on a surface of a workpiece e.g., a semiconductor wafer or dielectric plate or metal sheet to form dielectric, conductor, and semiconductor film layers that constitute an integrated circuit, for example. (Throughout, most of the remainder of this document, the workpiece is assumed to be a semiconductor wafer but it is to be understood that the invention is applicable to other types of workpieces.) In a chemical vapor deposition system, a process gas is injected into the plasma chamber in which a plasma is formed. Due to the ion bombardment within the plasma of the process gas ($SiH_4$ (silane), $SiF_4$ for example), silicon is deposited on a wafer which has been previously placed on a chuck in the chamber.

The chuck uses electrostatic force, for example, to hold the wafer securely in place during its processing. Since the workpiece covers the chuck during the processing of the semiconductor wafer, deposition of materials., e.g. silicon, onto the wafer bearing surface of the chuck is substantially prevented. However, in practice, a wafer may occasionally slide on the chuck, in which case a portion of the wafer bearing surface is exposed during the deposition process, causing deposition of material on the chuck wafer bearing surface. Alternatively, over time, deposition material may seep in under a wafer and leave a deposit on the chuck wafer bearing surface.

The presence of deposition material on the wafer bearing surface creates problems in the wafers that are manufactured in production runs. For example, deposition on the wafer may not have uniform thickness throughout the wafer as a result of hot spots created by the deposited material on the chuck wafer bearing surface.

Since creating deposition on wafers in a production run normally must have uniform thickness within precise tolerances, deposition on a chuck wafer bearing surface is a problem that must be corrected before additional wafers are processed. In the prior art, the process of removing the deposition from the chuck involved opening the sealed process chamber, removing the chuck, and cleaning the chuck with some material, such as hydrofluoric acid. This is a very expensive process since it shuts down the semiconductor manufacturing machine for a large number of hours. Time is required both to clean the chuck, as well as to re-prepare the chamber for continued processing. Since the chamber is a high vacuum chamber, it may take six or more hours to return the chamber to its operating condition. Also, if a chamber is opened for cleaning, a conditioning run of approximately 75 wafers must be executed before the processing can again be performed on production wafers.

It is known to remove deposition material (such as $SiO_2$ or flourine-doped $SiO_2$) in a sealed chamber by injecting a cleaning gas (such as $NF_3$) and then applying RF power to the chamber. The walls are cleaned of oxide deposition. This chamber cleaning is normally performed periodically during a production run, such as after every five wafers have been processed. In this known process, however, the chuck is kept covered since prolonged $NF_3$ exposure may damage the chuck and degrade the clamping force of the chuck. Another reason for covering the chuck in the prior art method is that temperature probes used in the chuck to measure the temperature of the wafer or for calibrating have been black body temperature probes that are damaged by exposure to $NF_3$ and plasma. As the chuck is covered during the cleaning of the process chamber, the only method of cleaning the deposition material from the chuck according to the prior art has been to open the chamber and remove the chuck. As stated earlier, this is a very expensive and time-consuming process.

SUMMARY OF THE INVENTION

There is a need for a method of cleaning the deposition material of a chuck in a semiconductor wafer manufacturing machine without opening the processing chamber of the machine.

This and other means are met by the present invention which provides a method of in-situ cleaning of a semiconductor wafer chuck. In this method, the processing chamber is maintained in a sealed condition with the chuck inside the chamber. The wafer bearing surface of the chuck is exposed and a cleaning gas is injected into the chamber. RF power is applied to the chamber to create a plasma that cleans the wafer bearing surface. The RF power energizes the plasma and creates reactions on the wafer bearing surface to dissociate the deposition material on the chuck.

In certain embodiments of the present invention, the cleaning gas is $NF_3$. While an excessive amount of exposure of $NF_3$ may damage a chuck, a limited amount of exposure does not degrade the operation of the chuck to a great extent. Furthermore, the use of temperature probes in the chuck that are not sensitive and damaged by either plasma or $NF_3$ allow the chuck to be exposed and cleaned in-situ.

The in-situ cleaning of the chuck has a number of advantages over the prior art methods of cleaning the chuck. For example, the mean time to clean the chuck and recondition the chamber is reduced drastically, from about 10–12 hours to approximately one hour, including the conditioning procedure. Also, the chuck is cleaned completely and uniformly with the method of the present invention. Since no operator contact is necessary, the in-situ $NF_3$ cleaning produces a consistent chuck surface. As there is no need to open the process chamber to the atmosphere, the reactor condition as a whole is not disrupted. The uniformity of the thickness and other film properties is improved by the in-situ cleaning of the chuck. Furthermore, the temperature probes in the chuck do not need to be re-calibrated after the cleaning, since their position is not moved. A "first wafer effect" that occurs on the first wafer processed after each in-situ clean is also reduced.

The foregoing and other features, aspects and advantages of the present invention will become more apparent from the following detailed description of the present invention when taken in conjunction with the accompanying drawings.

DETAILED DESCRIPTION OF EXEMPLARY EMBODIMENTS

Figure 1:
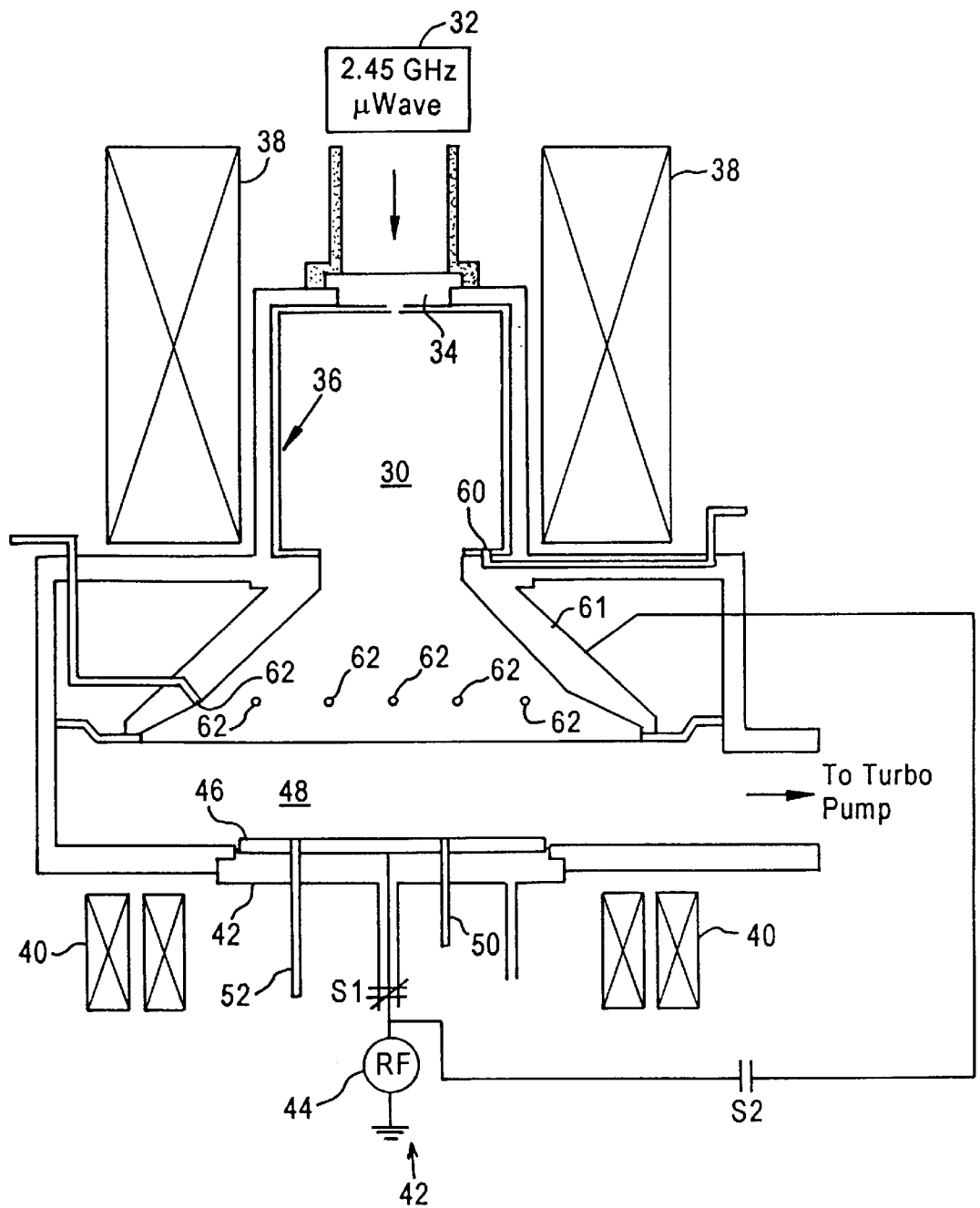
FIG. 1 is a schematic cross-sectional diagram of an electron cyclotron resonance chemical vapor deposition system in which a chuck is cleaned in accordance with an embodiment of the present invention.

A schematic depiction of a cross-section of an electron cyclotron resonance (ECR) chemical vapor deposition (CVD) system which performs the method according to the present invention is provided in FIG. 1. The system includes an electron cyclotron resonance plasma chamber 30 having a 2.45 GHz microwave power supply 32. The microwaves pass through a microwave window 34 into a plasma chamber 30. A quartz liner 36 lines the interior of the plasma chamber 30.

Plasmas are generated by the ionization of gas molecules. This is accomplished by an energetic electron striking a neutral molecule. Electrons also cause dissociation and other excitations. The electrons are excited by electric fields such as RF and microwaves. As such, these are the conventional methods of generating processing plasmas.

In contrast to conventional plasmas that typically operate at pressures greater than 70 millitorr, high density plasmas generally operate at pressures in the range of 0.5 to 10 millitorr. The ion to neutral ratio can be as high as one in a hundred, as compared to less than one in a million in low density plasmas. Ion densities can be more than $1 \times 10^{12}$ per cubic centimeter. Such plasmas require sophisticated plasma generation techniques such as electron cyclotron resonance.

In an electron cyclotron resonance plasma chamber, electron angular frequency due to the magnetic field matches a microwave frequency, so that electron cyclotron resonance occurs. In this state, electrons gain energy from the microwave source and accelerate in a circular motion. The cross-section for ionization is therefor effectively increased, allowing for the creation of high density plasma at low pressure.

The magnetic field is also used to extract the ions out of the plasma source. The ions follow the lines of induction toward the wafer. The plasma tends to be cone-shaped due to the divergent magnetic field. This divergent magnetic field creates a force that pulls the electrons out of the magnetic field. The resulting potential extracts ions to form a varied directional plasma stream.

The divergent magnetic field is created by a primary coil 38 that supplies the 875 Gauss needed for the electron cyclotron resonance condition. This primary coil 38 also provides the divergent magnetic field for ion extraction.

Auxiliary magnetic coils 40 behind a wafer holder assembly 42 shape the plasma into the desired shape. The wafer holder assembly 42 holds the wafer, not illustrated in FIG. 1. The wafer holder 42 includes a 13.56 MHz RF power supply (up to 3000 W). The RF power accelerates the ions from the plasma to cause sputtering on the wafer. It also provides, along with the microwaves, the electric fields that excite the electrons to generate the processing plasma.

An electrostatic chuck 46 is provided to hold the wafers within a reactor chamber 48 (also referred to as a "process chamber"). The use of an electrostatic chuck 46 obviates the need for mechanical clamping of the wafer. Wafer cooling is provided by helium, for example, to the underside or backside of the wafer through a helium supply line 50. Closed-loop control of the helium pressure regulates the wafer temperature during deposition. An in-situ wafer temperature monitoring is provided through a first temperature probe 52 which sends its sensor signals to a controller (not depicted).

A 3200 l/sec turbo molecular pump which can achieve a base pressure less than $1 \times 10^{-6}$ Torr is used to control the pressure within the plasma chamber 30 and the reactor chamber 48.

A conventional wafer transport mechanism, not depicted, is transports wafers into and out of the reactor chamber 48.

Oxygen and argon gas flows into the plasma chamber 30 through an injection port 60 from a gas supply source. Plasma is generated in the plasma chamber by applying the microwave energy and RF energy by the microwave generator 32 and the RF generator 44 to the gas flowing into chamber 30.

Once a wafer has been transported into the reactor chamber 48 by the wafer transport system and placed onto the electrostatic chuck 46, and a plasma has been generated within the plasma chamber 30, the deposition gas ($SiH_4$ or $SiF_4$, for example) is introduced into the plasma chamber 30 through one or more gas injection ports 62 that are separate from the gas injection port 60 through which the gas to form the plasma is provided.

The deposition process results in the surfaces of the plasma chamber 30 and the reactor chamber 40 becoming coated with a residue ($SiO_2$ or flourine-doped $SiO_2$). This residue is cleaned periodically from the surfaces of the chamber so that each wafer encounters the same environment, thereby making the process repeatable. Accordingly, the cleaning gas ($NF_3$, in the exemplary embodiment of the present invention) is introduced into the plasma chamber and RF power is applied from the RF generator 44 to the horn 61. This may be done after each wafer, or is typically done after the processing of every five wafers.

During the cleaning of the chamber 48 in a production run, a cover, i.e., dummy, wafer is transferred to the reactor chamber 48 and placed over the electrostatic chuck 46. The cover wafer is a standard silicon wafer coated with aluminum. The cover wafer protects the chuck wafer bearing surface from the plasma cleaning and conditioning step. It is desirable to cover the electrostatic chuck wafer bearing surface during routine cleaning of the process chamber since repeated exposure of the chuck wafer bearing surface to $NF_3$ damages the chuck wafer bearing surface and degrades the chuck clamping force.

In the processing of many wafers, however, occasionally a wafer slides from its position on the water bearing surface of electrostatic chuck 46 so that deposition occurs on the wafer bearing surface of the electrostatic chuck 46. Also, over time, deposition can seep in under the wafer and deposit on the water bearing surface of the electrostatic chuck 46 to the point where the electrostatic chuck 46 does not function properly and needs cleaning.

The determination of when a chuck 46 needs cleaning is made by visual inspection of the chuck through a port in the chamber, or by inspection of wafers that have been manufactured. Wafers are thin in certain sections; there is a hot area on the water bearing surface of chuck 46, indicating that the chuck 46 contains deposition material in that area and needs cleaning. In the prior art, once it had been determined that a chuck needed to be cleaned, the process chamber of the semiconductor manufacturing machine was opened and the chuck was removed. The chuck was cleaned with hydrofluoric acid or some other fluid to remove the deposition material. Since the chamber is operated in a high vacuum, opening therefor is highly detrimental. Once the chamber is opened, at least six hours must elapse to restore the process chamber back to its former condition after the chuck has been cleaned and replaced into the chamber. Also, after the vacuum has been restored 75 to 100 wafers must be processed before production wafers can be manufactured through the processing chamber.

Figure 2:
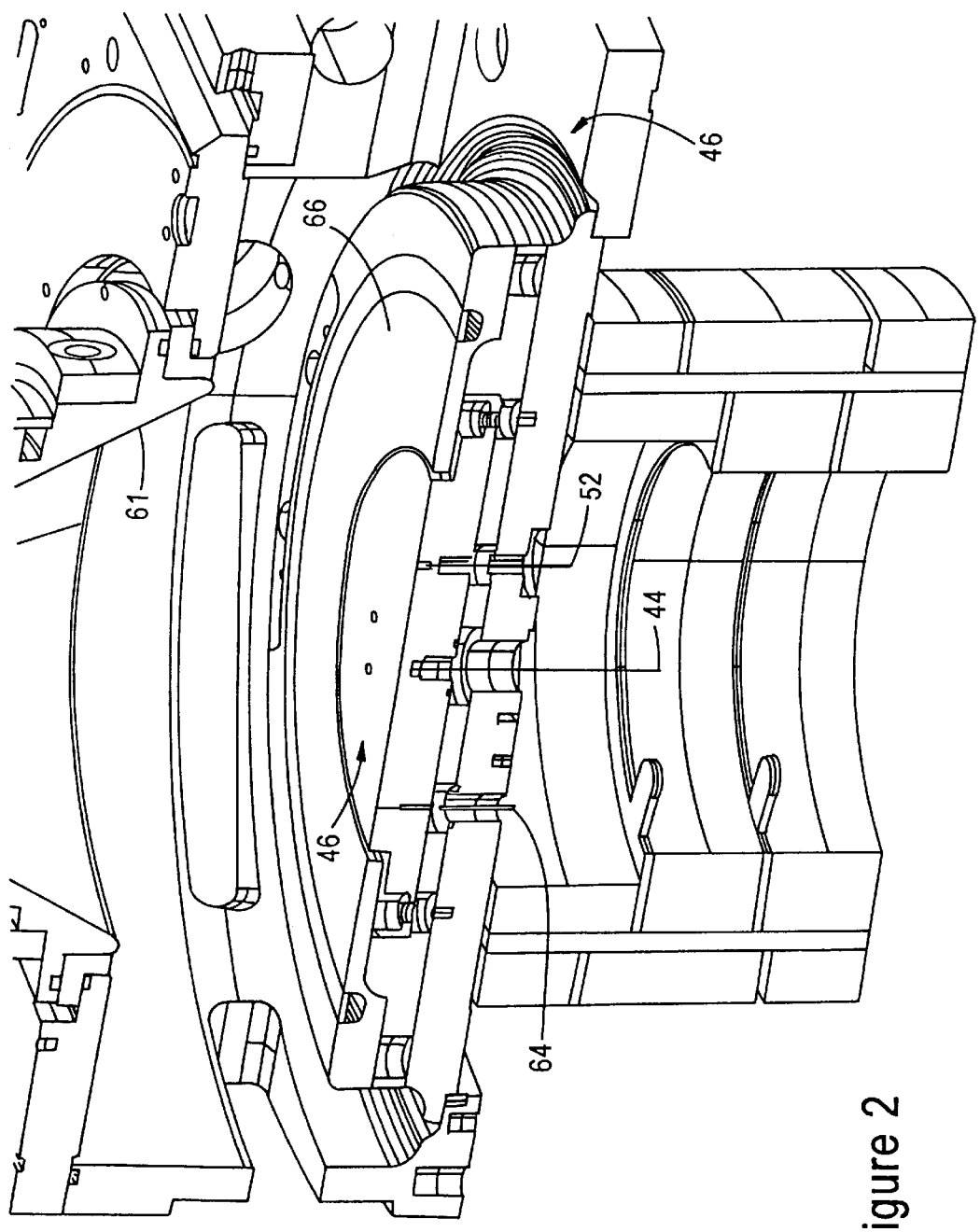
FIG. 2 is a three-dimensional partially sectional view of a chuck used in the system of FIG. 1.

The present invention overcomes the problems involved in the opening of a process chamber by cleaning the electrostatic chuck 46 in-situ. A three-dimensional cross-section of an exemplary embodiment of an electrostatic chuck 46 which can be used in the semiconductor manufacturing machine is depicted in FIG. 2. RF injection is provided during normal deposition to facilitate sputtering while depositing, as is known in the art. Two temperature probes 52 and 64 for monitoring the temperature of processed wafers are located on the wafer processing surface of chuck 46 are also provided. The temperature probe 52 is a phosphorous dot probe that is an optical fiber having a face abutting the bottom face of a wafer that is placed on the electrostatic chuck 46. A light pulse injected into the fiber is incident on the back face of the wafer on the water processing surface electrostatic of the chuck 46, the light pulse is reflected back into the fiber with a certain delay rate that is based on the water temperature. Since the fiber does not have a phosphor dot as provided in the black body temperature probes used in the prior art, the temperature probe 52 is not corrupted by occasional exposure to $NF_3$ and plasma. The temperature probe 52 acts as a wafer temperature probe and is used in the closed-loop control of the pressure of helium that is supplied through chuck 46 to the backside of the wafer to regulate the wafer temperature during deposition. The second temperature probe is an infrared probe 64 that is provided for calibration purposes. It is also not sensitive to the $NF_3$ or plasma.

Various grooves, not depicted, in the wafer bearing surface 66 of the electrostatic chuck 46 distribute the helium on the wafer bearing surface 66. Channels within the body of electrostatic chuck 46 distribute cooling water in the electrostatic chuck 46 to maintaining an even temperature throughout the electrostatic chuck 46.

Because the temperature probe 52 and the infrared probe 64 are not particularly adversely affected by infrequent exposure to $NF_3$ gas and plasma the electrostatic chuck 46 and its wafer bearing surface 66 can be exposed without ill effects to $NF_3$ gas (the cleaning gas) and a generated plasma in order to clean the wafer bearing surface 66. This is done without opening the reactor chamber 48 ("process chamber") so that down time caused by the requirement to clean the chuck 46 is reduced from 10–12 hours to approximately one hour.

Figure 3:
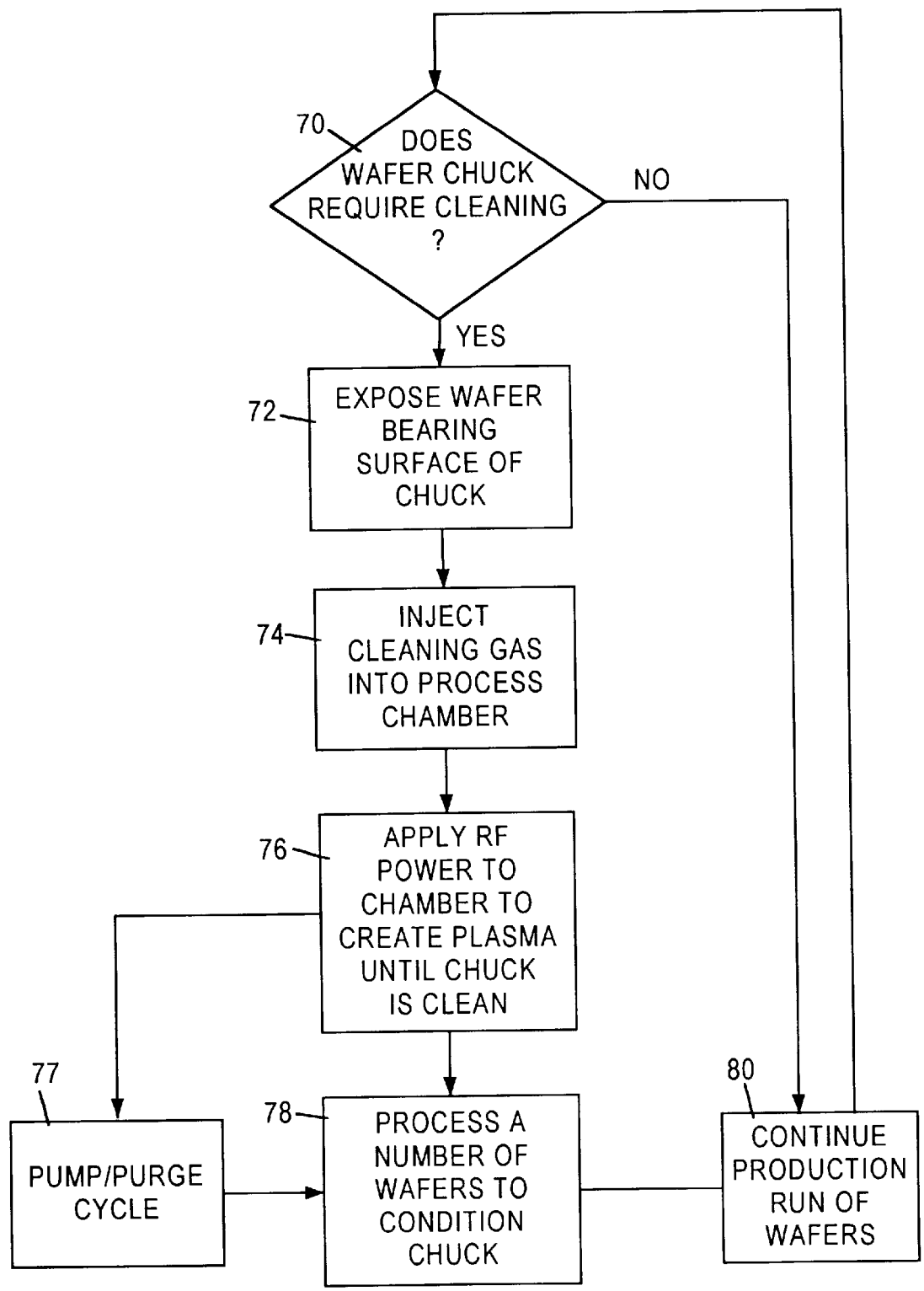
FIG. 3 is a flow chart of a method of cleaning a chuck in-situ in accordance with an embodiment of the present invention.

An exemplary embodiment of a method of cleaning an electrostatic chuck according to the present invention is depicted in the flow chart of FIG. 3. Throughout this process, the processing chamber 48 is maintained in a sealed condition with the electrostatic chuck 46 inside the chamber 48. In step 70, an operator determines whether the wafer bearing surface 66 of the chuck 46 requires cleaning. This is done by a direct visual inspection of the chuck 46, or by inference through an inspection of the wafers that have been manufactured. If the chuck requires cleaning, the wafer bearing surface 66 of the chuck 46 is then exposed in step 72. A cleaning gas, such as $NF_3$ is then injected into the chamber 48 in step 74. RF power is applied in step 76 to the chamber whereby the cleaning gas is ionized to create a plasma that cleans the wafer bearing surface 66. In this case, the RF power is applied my source 32 to horn feed 61 (FIGS. 1 and 3) while all the other surfaces except for those of the electrostatic chuck 46 are grounded (step 76). The RF power energizes cleaning gas to form the plasma and creates reactions on the wafer bearing surface 66 of the electrostatic chuck 46. The application of a turbo pump removes from the chamber 48 the deposition material that has been dissociated from the chuck 46.

The application of the RF power and exposure of the wafer bearing surface 66 of the electrostatic chuck 46 to the plasma is typically for approximately 100 to 300 seconds. Determination that the wafer bearing surface has been adequately cleaned is preferably made by a visual inspection of that surface while the process chamber 46 is still sealed.

Following the cleaning of the wafer bearing surface 66, a pump/purge cycle is performed to remove any particles present in the chamber (step 77). Then, in step 78 a small number of dummy wafers (e.g., 5–10 wafers) are processed in the reactor. This step is performed since the chucking force exerted by the electrostatic chuck 46 is increased due to the in-situ cleaning and therefor the cooling provided to the wafers is also increased. As a result, the dummy wafers do not reach the regular operating temperature, but through the course of 5–10 dummy wafers, the chuck 46 returns to its normal condition and the reactor is ready to continue or initiate its production runs (step 80).

The in-situ cleaning of the chuck dramatically degreases the mean time to clean the chuck 46 and recondition the chamber 48. It is also used to condition new chucks by removing residual films from the manufacturing process. This process, however, is not limited to electron cyclotron resonance chemical vapor deposition machines, but is also applicable to other semiconductor manufacturing machines. For example, the process can be applied to etching machines, or any other manufacturing machines in which a plasma is generated and a workpiece chuck is used that may become contaminated. An example of such a machine is an etching machine.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of operating a vacuum plasma processing chamber including a chuck having a workpiece receiving surface on which workpieces are chucked during processing, comprising
    (a) processing the workpieces with a plasma while maintaining the chamber in a vacuum and the workpieces are chucked to the workpiece receiving surface;
    (b) from time to time, between workpiece processing, cleaning the chamber with a plasma etchant while (i) maintaining the chamber in the vacuum and (ii) covering the workpiece receiving surface so the workpiece receiving surface is not cleaned;
    (c) from time to time, between workpiece processing, cleaning the chamber with a plasma etchant while (i) maintaining the chamber in the vacuum and (ii) exposing the workpiece receiving surface so the workpiece receiving surface is cleaned;
    step (b) being repeated and performed more often than step (c), and step (a) being repeated and performed more often than step (b).

2. The method of claim 1 further including detecting that the chuck needs cleaning, and performing step (c) in response to the chuck being detected as needing cleaning.

3. The method of claim 1 wherein step (b) is performed by chucking a first workpiece to the workpiece receiving surface.

4. The method of claim 1 wherein step (a) is repeated and further including covering the chuck workpiece receiving surface with plural first workpieces that are separately applied to the chuck workpiece receiving surface after step (c) is performed and before step (a) is repeated, the plural first workpieces being exposed to plasma.

5. The method of claim 4 further including cooling the processed and dummy workpieces by applying coolant to the chuck while the processed and dummy workpieces are clamped to the chuck, the chuck coolant having a tendency to cause the temperature of the workpieces to be lowered from a normal processing temperature as a result of step (c) being performed, and performing the covering step of claim 4 a sufficient number of times until the chuck coolant is such that the workpieces are at the normal processing temperature.

6. The method of claim 1 wherein the plasma during workpiece processing of step (a) is a microwave plasma excited by microwaves passing through a metal horn, the plasma of steps (b) and (c) being an r.f. plasma excited by applying an r.f. voltage source to an electrode of the chuck and the metal horn.

7. The method of claim 6 further including detecting that the chuck needs cleaning, and performing step (c) in response to the chuck being detected as needing cleaning.

8. The method of claim 6 wherein step (b) is performed by clamping a dummy workpiece to the workpiece receiving surface.

9. The method of claim 6 wherein step (a) is repeated and further including covering the chuck workpiece receiving surface with plural first workpieces that are separately applied to the chuck workpiece receiving surface after step (c) is performed and before step (a) is performed, the plural first workpieces being exposed to plasma.

10. The method of claim 9 further including cooling the processed and the plural first workpieces by applying coolant to the chuck while the processed and plural first workpieces are chucked to the chuck, the chuck coolant having a tendency to cause the temperature of the workpieces to be lowered from a normal processing temperature as a result of step (c) being performed, and performing the covering step of claim 9 a sufficient number of times until the chuck coolant is such that the workpieces are at the normal processing temperature.

11. A method of operating a vacuum plasma processing chamber including a chuck having a workpiece receiving surface on which workpieces are chucked during processing, comprising (a) processing the workpieces with a plasma while (i) maintaining the chamber in a vacuum and (ii) the workpieces are chucked to the workpiece receiving surface; and (b) from time to time, between workpiece processing, repeatedly cleaning the chamber with a plasma etchant while (i) maintaining the chamber in the vacuum and (ii) exposing the workpiece receiving surface so that the workpiece receiving surface is cleaned and the chuck temperature decreases;

step (a) being repeated and performed more often than step (b);

(c) after performing step (b), heating the chuck before performing step (a) again, the chuck being heated so workpieces processed the next time step (a) is performed are at normal processing operating temperatures.

12. The method of claim 11 wherein the chuck is heated by covering the chuck workpiece receiving surface with plural first workpieces that are separately applied to the chuck workpiece receiving surface after step (b) is performed and before step (a) is performed, the chuck being heated by the plural first workpieces being heated by being exposed to plasma.

13. The method of claim 12 further including cooling the processed and plural first workpieces by applying coolant to the chuck while the processed and plural first workpieces are chucked to the chuck, the chuck coolant causing the temperature of the workpieces to be lowered from a normal processing temperature as a result of step (b) being performed, covering the chuck workpiece receiving surface with plural first workpieces that are separately applied to the chuck workpiece receiving surface after step (c) is performed and before step (a) is performed, the plural first workpieces being exposed to plasma, performing the covering step of claim 12 a sufficient number of times until the chuck temperature is such that the workpieces are at the normal processing temperature.

14. The method of claim 11, further including detecting that the chuck needs cleaning, and performing step (b) in response to the chuck being detected as needing cleaning.

15. The method of claim 11 wherein the plasma during the workpiece processing of step (a) is a microwave plasma excited by microwaves passing through a metal horn, the plasma of step (b) being an r.f. plasma excited by applying an r.f. voltage source to an electrode of the chuck and the metal horn.

16. A method of cleaning a workpiece receiving surface of a chuck for holding workpieces during plasma processing in a vacuum plasma processing chambers wherein the workpieces are processed by a microwave plasma excited by microwaves passing through a metal horns comprising the cleaning being performed by applying an r.f. plasma to the workpiece receiving surface, the r.f. plasma being excited by applying an r.f. voltage source to an electrode of the chuck and the metal horn.

17. The method of claim 16 further including detecting that the chuck needs cleaning, and performing the r.f. applying step in response to the chuck being detected as needing cleaning.

* * * * *